United States Patent
Tse et al.

(10) Patent No.: US 12,446,156 B2
(45) Date of Patent: Oct. 14, 2025

(54) NETWORK DEVICE WITH ELEVATED TEMPERATURE SENSOR

(71) Applicant: Arista Networks, Inc., Santa Clara, CA (US)

(72) Inventors: Eric Jau Heng Tse, Mountain View, CA (US); Arshdeep Kaur, Santa Clara, CA (US); Andrew D Boyko, Sunnyvale, CA (US); Xin Xue, San Jose, CA (US); Richard Neville Hibbs, Carmel-by-the-Sea, CA (US)

(73) Assignee: Arista Networks, Inc., Santa Clara, CA (US)

( * ) Notice: Subject to any disclaimer, the term of this patent is extended or adjusted under 35 U.S.C. 154(b) by 186 days.

(21) Appl. No.: 18/320,730

(22) Filed: May 19, 2023

(65) Prior Publication Data

US 2024/0389233 A1 Nov. 21, 2024

(51) Int. Cl.
| | | |
|---|---|---|
| *H05K 1/14* | (2006.01) | |
| *G06F 13/38* | (2006.01) | |
| *G06F 13/42* | (2006.01) | |
| *H05K 1/18* | (2006.01) | |
| *H01R 12/79* | (2011.01) | |

(52) U.S. Cl.
CPC ......... *H05K 1/142* (2013.01); *G06F 13/382* (2013.01); *G06F 13/4282* (2013.01); *H05K 1/183* (2013.01); *G06F 2213/0042* (2013.01); *H01R 12/79* (2013.01); *H05K 2201/10151* (2013.01)

(58) Field of Classification Search
CPC ...... H05K 1/142; H05K 1/183; G06F 13/382; G06F 13/4282; H01R 12/79
USPC .......................................... 361/764
See application file for complete search history.

(56) References Cited

U.S. PATENT DOCUMENTS

| | | |
|---|---|---|
| 6,573,704 B2 | 6/2003 | Mirov |
| 7,075,407 B1 | 7/2006 | Kawamoto et al. |
| 7,785,004 B2 | 8/2010 | Kautz et al. |
| 8,978,474 B2 | 3/2015 | Bottkol et al. |
| 2015/0011258 A1* | 1/2015 | Rang ................ H04M 1/72412 455/556.1 |
| 2015/0063423 A1 | 3/2015 | Hua |

(Continued)

FOREIGN PATENT DOCUMENTS

| | | | |
|---|---|---|---|
| EP | 2309238 | * | 5/2016 |
| EP | 2309238 B1 | | 5/2016 |

*Primary Examiner* — Andargie M Aychillhum
(74) *Attorney, Agent, or Firm* — Treyz Law Group; Jason Tsai

(57) ABSTRACT

A network device that includes a temperature sensor module is provided. The network device can include a host printed circuit board, one or more processors mounted on a surface of the host printed circuit board, a port protruding from the surface of the host printed circuit board, and a temperature sensor module that is raised over the surface of the host printed circuit board to provide thermal decoupling from the surface of the host printed circuit board. The temperature sensor module can include a sensor printed circuit board, a temperature sensor integrated circuit die disposed on a first side of the sensor printed circuit board, and an exposed conductive pad disposed on a second side of the sensor printed circuit board. The temperature sensor module can include multiple exposed contacts or a plug configured to mate with the protruding port.

20 Claims, 9 Drawing Sheets

(56) References Cited

U.S. PATENT DOCUMENTS

| | | | |
|---|---|---|---|
| 2015/0208900 A1* | 7/2015 | Vidas | A61B 1/00177 348/74 |
| 2015/0289365 A1* | 10/2015 | Hunat | H01L 23/552 257/459 |
| 2022/0113200 A1* | 4/2022 | Luo | G01K 7/22 |

* cited by examiner

NETWORK DEVICE WITH ELEVATED TEMPERATURE SENSOR

BACKGROUND

A network device can include various electrical components mounted on a printed circuit board (PCB). Components mounted on a printed circuit board of a network device can include a central processing unit (CPU), a packet processor, memory devices, a power management unit, fans, and other electrical components.

A network device can be further provided with a digital temperature sensor. Conventionally, the digital temperature sensor is soldered down directly onto a surface of the printed circuit board of the network device. Such surface-mounted digital temperature sensor can suffer from loss of accuracy due to external influence from nearby electrical components as well as thermal dissipation from the PCB itself. It is within such context that the embodiments herein arise.

DETAILED DESCRIPTION

A network device can include various electrical components mounted on one or more printed circuit board (PCB), sometimes referred to as a main PCB or host PCB. Components mounted on a printed circuit board can include one or more processors such as a central processing unit (CPU), a packet processor, a field programmable gate array (FPGA), a complex programmable logic device (CPLD), memory devices such as random-access memory and non-volatile memory, a hardware controller, a power management unit, one or more fans, and one or more temperature sensor. The temperature sensor may be a digital temperature sensor configured to measure an internal ambient temperature of the network device, an external ambient temperature around the network device, an exhaust air temperature at an exhaust vent of the network device, and/or an inlet air temperature at an intake vent of the network device.

The temperature sensor may be included as part of a temperature sensor module. The temperature sensor module may include a sensor electrical board or sensor PCB on which the temperature sensor is mounted and a connector configured to mate with a corresponding connector port protruding from the host PCB. The connector port may be a USB port, mini USB port, micro USB port, USB-C port, lighting connector port, flexible printed circuit (FPC) port, flat flexible cable (FFC) port, JTAG (Joint Test Action Group) port, or other types of hot pluggable connector ports.

When the temperature sensor module is plugged into such connector port on the host PCB, the sensor board extends away from the surface of the host PCB so that the temperature sensor is elevated or raised from the surface of the host PCB by a height that exceeds some predetermined threshold. The sensor board may include a cutout of any shape to provide further thermal isolation for the temperature sensor. The temperature sensor may comprise a temperature sensor die that is mounted on one side of the sensor board and that is coupled to an exposed metal pad on an opposing side of the sensor board through a via in the sensor board. The temperature sensor module can be oriented so that the exposed metal pad is parallel to the air flow being measured. If desired, the network device can include more than one temperature sensor disposed in different locations within the house of the network device.

Figure 1:
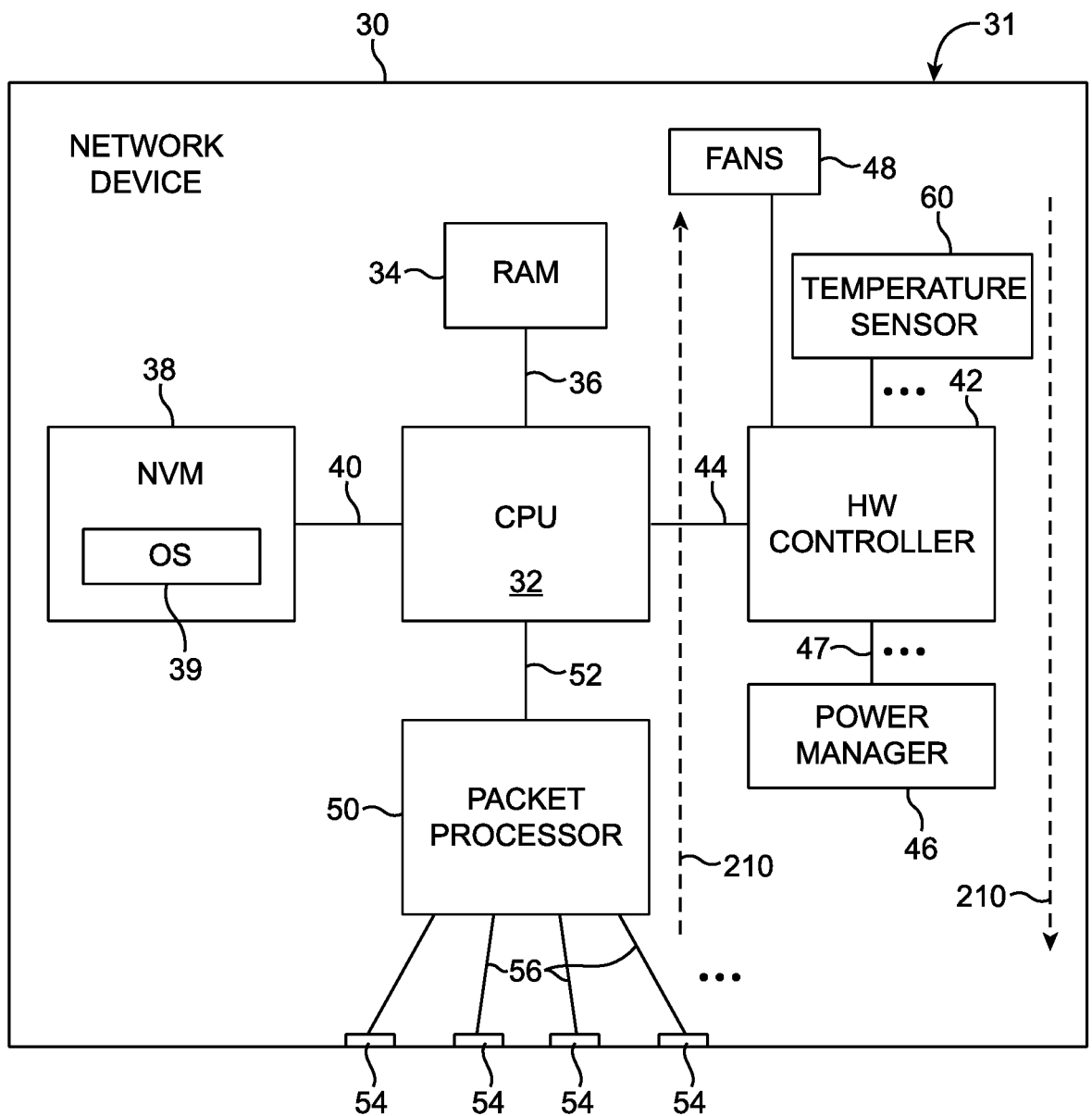
FIG. 1 is a diagram of an illustrative network device having various hardware components including a temperature sensor in accordance with some embodiments.

FIG. 1 is a diagram of an illustrative network device such as network device 30 that can be provided with one or more temperature sensors. Network device 30 may be a switch, a router, a bridge, a hub, a repeater, a firewall, a device serving other networking functions, a device that includes a combination of these functions, or other types of network elements. As an example, network device 30 can be part of a host device that is coupled to one or more output devices and/or to one or more input devices. The input device(s) may include one or more touchscreens, keyboards, mice, microphones, touchpads, electronic pens, joysticks, buttons, sensors, or any other type of input devices. The output device(s) may include one or more displays, printers, speakers, status indicators, external storage, or any other type of output devices. Network device 30 may be part of a digital system or a hybrid system that includes both digital and analog subsystems. Such system may be used in a wide variety of applications as part of a larger computing system, which may include but is not limited to: a datacenter, a computer networking system, a data networking system, a digital signal processing system, a graphics processing system, a video processing system, a computer vision processing system, a cellular base station, a virtual reality or augmented reality system, a network functions virtualization platform, an artificial neural network, an autonomous driving system, a combination of at least some of these systems, and/or other suitable types of computing systems.

As shown in FIG. 1, network device 30 may include processing circuitry such as a central processing unit (CPU) 32, storage circuitry including volatile memory such as random-access memory (RAM) 34 and nonvolatile memory (NVM) 38, a packet processing circuit such as packet processor 50, a control circuit such as hardware controller 42, and a power management circuit such as power manager 46 all contained within a device housing 31. Housing 31 may be made from plastic or other thermoplastic polymer, metal such as aluminum, steel, or other metal alloys, or other rigid material that can provide proper external protection and structural support for network device 30. In general, processing unit 32 may represent processing circuitry based on one or more microprocessors, graphics processing units (GPUs), host processors, general-purpose processors, microcontrollers, digital signal processors, application specific integrated circuits (ASICs), application specific system processors (ASSPs), programmable logic devices such as field-programmable gate arrays (FPGAs), a combination of these processors, or other types of processors. Central processing unit 32 may sometimes be referred to herein as a main processor 32.

The processing circuitry, which can include CPU 32, and the storage circuitry, which can include random-access memory 34 and non-volatile memory 38, are sometimes referred to collectively as control circuitry. The control (processing and storage) circuitry are therefore sometimes referred to as being part of a control plane of network device 30. Components in the control plane of network device 30 may exchange network topology information with other network devices and construct routing tables such as software forwarding tables using a routing protocol. Routing protocols are software mechanisms by which multiple network devices communicate and share information about the topology of the network and the capabilities of each network device. For example, network routing protocols executed on device 30 may include Border Gateway Protocol (BGP) or other distance vector routing protocols, Enhanced Interior Gateway Routing Protocol (EIGRP), Exterior Gateway Protocol (EGP), Routing Information Protocol (RIP), Open Shortest Path First (OSPF) protocol, Label Distribution Protocol (LDP), Multiprotocol Label Switching (MPLS), intermediate system to intermediate system (IS-IS) protocol, Protocol Independent Multicast (PIM), Virtual Routing Redundancy Protocol (VRRP), Hot Standby Router Protocol (HSRP), and/or other Internet routing protocols (just to name a few).

The storage circuitry may include non-transitory (tangible) computer readable storage media that stores an operating system and/or any software code, sometimes referred to as program instructions, software, data, instructions, or code. Non-volatile memory 38 is a type of computer memory that can retain stored information even after power is removed and is therefore sometimes referred to as "persistent" storage. Examples of non-volatile memory 38 include flash memory, solid-state drive (SSD), read-only memory (ROM), electrically programmable ROM, disk storage, hard disk drive, optical disc, etc. In contrast, volatile memory 34 is a type of computer memory that needs power to retain stored information (e.g., the stored data is lost once power is removed). Examples of volatile memory 34 include dynamic random-access memory (DRAM) and static random-access memory (SRAM). Volatile memory 34 is often referred to as "primary storage" (also referred to as main storage or system storage), whereas nonvolatile memory 38 is sometimes referred to as "mass storage."

Main processor 32 may be coupled to the volatile memory (RAM) 34 via path 36. Path 36 may (for example be a double data rate (DDR) interface such as a DDR type-3 (DDR3) or DDR type-4 (DDR4) interface. RAM 34 may be implemented as a single in-line memory module (SIMM) component or a dual in-line memory module (DIMM) component (as examples). Main processor 32 may be coupled to non-volatile memory 38 via path 40. Path 40 may (for example) be a Serial AT Attachment (SATA) bus interface, an Ethernet bus interface, a Universal Serial Bus (USB) bus interface, or other mass storage computer bus interface(s). Processor 32 may be used to run a network device operating system such as operating system (OS) 39 and/or other software/firmware that is stored on nonvolatile memory 38. Operating system 39 may be a network operating system configured to manage computer network resources for data centers, cloud networks, and other network systems. Operating system 39 may be scalable to support, manage, and/or provision hundreds or thousands of compute and storage nodes in the overall network. Operating system 39 may be a Linux based operating system, a UNIX based operating system, a Microsoft Windows based operating system, a Mac based operating system, or other types of network operating systems. Operating system 39 may be programmable and modular. Operating system 39 can provide live patching and upgrade of individual processes during normal network operation, self-healing resiliency for minimum network downtime, custom monitoring capabilities to provide visibility into application performance, troubleshooting capabilities to identify network performance problems, and other network functions.

Packet processor 50 is oftentimes referred to as being part of the data plane or forwarding plane. Main processor 32 may be coupled to packet processor 50 via path 52. Path 52 may be a Peripheral Component Interconnect Express (PCIe) interface (as an example) or other processor-to-processor computer bus interface. Packet processor 50 can be implemented as a field-programmable gate array (FPGA) to provide improved programmability/flexibility or can be implemented as other types of processors and is sometimes referred to as a packet processing chip or a network processing unit (NPU). Packet processor 50 is coupled to input-output (IO) ports 54 via paths 56 and receives and outputs data packets via ports 54. Ports 54 are sometimes referred to as ingress-egress ports or interfaces. Packet processor 50 can analyze the received data packets, process the data packets in accordance with a network protocol, and forward (or drop) the data packets accordingly. Data packets received in the data plane may optionally be analyzed in the control plane to handle more complex signaling protocols.

Main processor 32 may also be coupled to hardware controller 42 via path 44. Path 44 may, for example, be an Inter-Integrated-Circuit (I2C) communication bus, Universal Asynchronous Reception and Transmission (UART) communication bus, Serial Peripheral Interface (SPI) communication bus, or other types of controller based interfaces. Hardware controller 42 can be a programmable logic device such as a complex programmable logic device (CPLD) that is configured to control one or more hardware pins associated with network device 30 in order to control one or more peripheral hardware components on device 30 such as to manage the operation of fans, sensors (e.g., temperature sensors), audio components, batteries, power supplies, etc.

Hardware controller 42 may be coupled to power manager 46 via path 47. Similar to path 44, path 47 may be an Inter-Integrated-Circuit (I2C) communication bus, Universal Asynchronous Reception and Transmission (UART) communication bus, Serial Peripheral Interface (SPI) communication bus, or other types of controller based interfaces. Power manager 46 (sometimes referred to as a power management device or power management unit) may be configured to control power sequencing operations on network device 30, to monitor individual power rails (power supply lines) on network device 30, to detect other events associated with one or more power supplies on network device 30, and/or to provide other power management functions for network device 30.

Hardware controller 42 may also be coupled to one or more fans 48. Fans 48 may be configured to direct air flow within network device 30 for the purpose of reducing an ambient temperature within and around the housing 31 of network device 30. In some embodiments, fans 48 can be disposed at a rear end of the device 30 away from packet processor 50 and away from the front panel ports 54. In general, the end of the network device 30 where the ingress/egress ports 54 are located can be referred to as the "front" end of the device housing 31, whereas the opposing end can be referred to as the "rear" end of the device housing 31.

Device configurations in which at least one fan 48 is located at the rear end of device 30 to direct air flow between the front panel and the rear panel of housing 31 as shown by dotted arrows 210 are sometimes described herein as an example. Although arrows 210 show air flow in both directions, the air flow can be in either direction (e.g., front to back or back to front). In general, fans 48 can be disposed at one or more locations within device 30, can be disposed near the front end of device 30 where the front panel ports 54 are located, can be disposed at the lateral sides of device 30 between the front end and rear end of device 30, can be disposed at or near a corner of device 30, can be disposed at or near an air exhaust vent of device 30, can be disposed at or near an air intake vent of device 30, or can be disposed at any suitable location within device 30.

Hardware controller 42 may be further coupled to one or more temperature sensor 60. Temperature sensor 60 may be a digital temperature sensor. As an example, temperature sensor 60 may be configured to measure an internal temperature within the housing of network device 30 and can therefore sometimes be referred to as an internal ambient temperature sensor. As another example, temperature sensor 60 may be configured to measure an external temperature outside or surrounding the housing of network device 30 and can therefore sometimes be referred to as an external ambient temperature sensor. As another example, temperature sensor 60 may be configured to measure the temperature of air flowing through an exhaust vent of network device 30 and can therefore sometimes be referred to as an exhaust air temperature sensor. As another example, temperature sensor 60 may be configured to measure the temperature of air flowing through an intake (inlet) vent of network device 30 and can therefore sometimes be referred to as an intake (inlet) air temperature sensor. These examples are illustrative. If desired, other types of temperature sensors 60 can be employed within network device wherein the sensor integrated circuit is suspended over a region on the host printed circuit board that is non-overlapping with the port 30.

The number of hardware components shown in FIG. 1 is merely illustrative and is not intended to limit the scope of the present embodiments. If desired, network device 30 may include more components than the ones shown in FIG. 1 or may include fewer components than the ones shown in FIG. 1. The hardware components of FIG. 1 (e.g., components 32, 34, 38, 42, 46, 48, and 50) may be mounted on a printed circuit board sometimes referred to as a mother board, a host board, a main board, or other electrical component mounting substrate or carrier layer.

Conventionally, a temperature sensor has leads that are soldered down directly onto a surface of the host board of a network device. Such surface-mounted temperature sensor can suffer from loss of accuracy due to external influence from nearby electrical components as well as thermal dissipation from the host board itself. Moreover, surface-mount temperature sensors are better at monitoring temperatures at just the surface of the host board rather than the ambient temperature above the surface of the host board.

Figure 2:
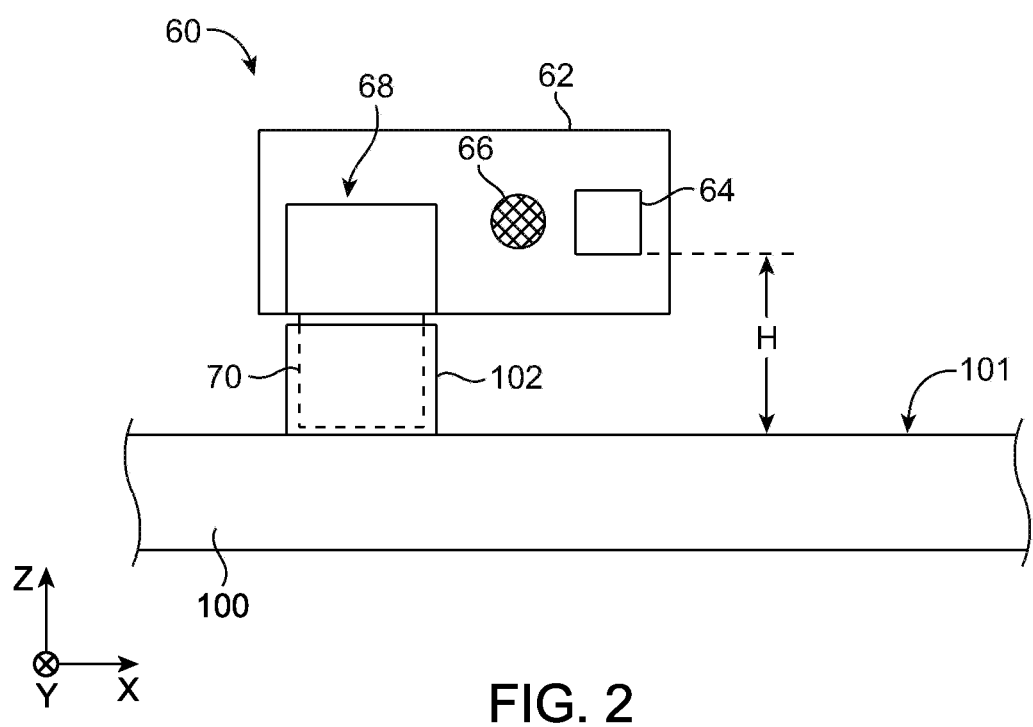
FIG. 2 is a side view of an illustrative temperature sensor module that is plugged into a port protruding from a printed circuit board in accordance with some embodiments.

In accordance with some embodiments, network device 30 can be provided with a temperature sensor that is elevated or raised above a surface of the main printed circuit board. FIG. 2 is a side view of an illustrative temperature sensor such as temperature sensor 60 that can be plugged into a port protruding from a printed circuit board 100. Printed circuit board 100 can represent the main PCB or host board on which other components within network device 30 are mounted. For example, central processing unit 32, packet processor 50, other processors, memory devices 34 and 38, hardware controller 42, power manager 46, fans 48, and/or other electrical components can be mounted on one or more surfaces of host circuit board 100. Host circuit board 100 may have a surface 101 that is coplanar with the X-Y plane in FIG. 2.

A connector port such as port 102 may be mounted on surface 101 of host circuit board 100. Port 102 may be a Universal Serial Bus (USB) port, mini USB port, micro USB port, USB-C port, other types of USB ports, lighting connector port, flexible printed circuit (FPC) port, flat flexible cable (FFC) port, JTAG (Joint Test Action Group) port, or other types of hot pluggable connector ports. A USB, mini USB, micro USB, USB-C, and/or other types of USB ports can all be referred to and defined herein as "USB type" sockets. Connector port 102 that is configured to receive a corresponding mating plug of the same connection type is sometimes referred to as a socket. Port (socket) 102 may protrude vertically from surface 101 of board 100 in the Z (height) direction.

Temperature sensor 60 may include a printed circuit board 62, a temperature sensor die such as temperature sensor integrated circuit (IC) 64, and a plug 68. The printed circuit board 62 of temperature sensor 60 is sometimes referred to as a temperature sensor printed circuit board or a temperature sensor board. Plug 68 may be attached to temperature sensor board 62 and may have a connector portion 70 configured to mate with port 102 on the host board 100. In the example where port 102 on the host side is a USB port, connector 70 on the sensor side can be a corresponding mating USB connector. In the example where port 102 on the host side is a mini USB port, connector 70 on the sensor side can be a corresponding mating mini USB connector. In the example where port 102 on the host side is a micro USB port, connector 70 on the sensor side can be a corresponding mating micro USB connector. In the example where port 102 on the host side is a USB-C port, connector 70 on the sensor side can be a corresponding mating USB-C connector. In the example where port 102 on the host side is a lightning port, connector 70 on the sensor side can be a corresponding mating lightning connector. In the example where port 102 on the host side is an FPC/FFC port, connector 70 on the sensor side can be a corresponding mating FPC/FFC connector. In the example where port 102 on the host side is a JTAG port, connector 70 on the sensor side can be a corresponding mating JTAG connector. In general, plug 68 of temperature sensor 60 can include any type of connector.

Plug 68 can be attached on a first (surface) of temperature sensor board 62. The first side (surface) of temperature sensor board 62 may be coplanar with the X-Z plane in FIG. 2. Temperature sensor IC (die) 64 can also be mounted on the first side (surface) of temperature sensor board 62. This is merely illustrative. Plug 68 and temperature sensor IC 64 can be formed on opposing sides (surfaces) of temperature sensor board 62. Temperature sensor IC 64 may be electrically coupled to connector 70 via one or more conductive lines formed in temperature sensor board 62. Temperature sensor 60 that includes these various sub-components (e.g., temperature sensor board 62, temperature sensor die 64, and plug 68) are sometimes referred to and defined collectively herein as a "temperature sensor module."

Configured in this way, the temperature sensor IC 64 of the temperature sensor module 60 can be elevated or raised with respect to the surface 101 of host board 100 by a distance or height H. A greater height H can be technically advantageous or beneficial by ensuring that the temperature reading being measured by temperature sensor IC 64 is less of a function of the temperature at the surface 101 of host board 100 but rather more of a function of the ambient temperature in or around the housing of the overall network device 30. The distance H at which temperature sensor IC 64 is elevated above the host board surface 101 can be at least 5 millimeters (mm), 4-6 mm. 3-7 mm, 2-8 mm, more than 2 mm, more than 3 mm, more than 4 mm, more than 5 mm, more than 6 mm, more than 7 mm, 5-10 mm, or more than 10 mm. Moreover, the temperature sensor IC 64 is suspended over a region on host printed circuit board 100 that is non-overlapping with port 102 (e.g., IC 64 is not disposed directly over or above port 102).

Still referring to FIG. 2, temperature sensor board 62 can optionally include one or more cutout portions such as cutout portion 66 interposed between temperature sensor IC 64 and plug 68. Cutout portion 66 may be a circular through hole (as shown in the example of FIG. 2). Configured in this way, cutout portion 66 can help provide further temperature isolation and thermal decoupling between IC die 64 and connector portion 70 that is physically mated with port 102. Temperature sensor module 60 can include any number of cutout portions 66 (e.g., the sensor board can include two or more separate through holes, three or more separate through holes, four or more separate through holes, five to ten through holes, or more than ten through holes). Cutout portion 66 can also have any shape (e.g., cutout 66 can be a circular through hole, a square through hole, a triangular through hole, a pentagonal through hole, a hexagonal through hole, an octagonal through hole, a tapered through hole, etc.).

Figure 3:
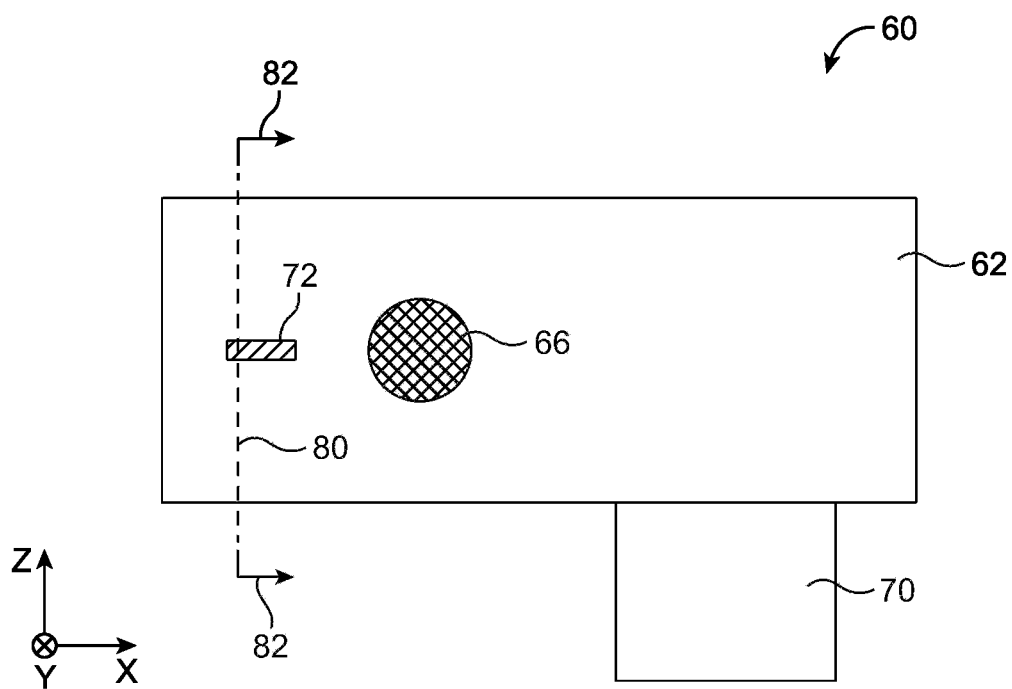
FIG. 3 is another side view of the temperature sensor module shown in FIG. 2 in accordance with some embodiments.

FIG. 3 is a side view showing the other side (second surface) of temperature sensor module 60 of the type described above in connection with FIG. 2. As shown in FIG. 3, connector 70 is attached to the first side of temperature sensor board 62 but protrudes downwards in the Z direction so is visible from the second side. Through hole 66 extends between the two opposing surfaces of the temperature sensor board 62 so is also visible from the second side. An exposed conductive pad 72 may be formed at the second surface. Conductive pad 72 may be formed from copper, platinum, nickel, tungsten, iron, gold, silver, lead, zinc, aluminum, a combination of these materials, and/or other metal(s) suitable for temperature sensing. Conductive pad 72 formed at the outer surface of temperature sensor board 62 is therefore sometimes referred to as an exposed metal pad.

Conductive pad 72 can be electrically coupled to temperature sensor IC 64 through a via within sensor board 62. This can be seen in a cross-sectional view of FIG. 3 cut along line 80 and viewed in the direction of arrow 82 (sec, e.g., FIG. 4). As shown in the cross-section of FIG. 4, temperature sensor IC 64 may be disposed at a first side of temperature sensor board 62, whereas conductive pad 72 may be formed at a second side of temperature sensor board 62. A conductive via such as via 74 may electrically connect conductive pad 72 to temperature sensor IC 64. Configured in this way, air or air flow that comes into physical contact with the exposed conductive pad 72 can result in a corresponding temperature sensor reading or output associated with the air (flow) generated at temperature sensor IC 64. The arrangement of FIG. 4 in which temperature sensor die 64 and metal pad 72 are formed at opposing surfaces of the temperature sensor board 62 is exemplary. If desired, temperature sensor die 64 and exposed metal pad 72 can be formed on the same surface of the temperature sensor board 62.

Figure 4:
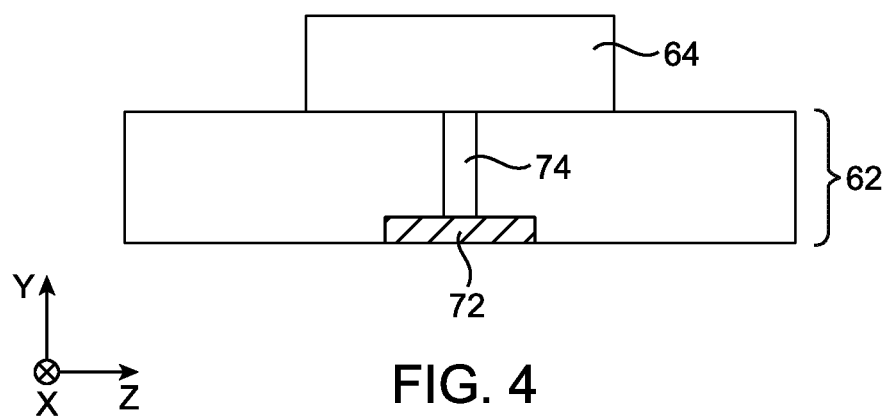
FIG. 4 is cross-sectional side view of an illustrative temperature sensor module having a temperature sensor integrated circuit coupled to a conductive pad through a via in accordance with some embodiments.
Figure 5:
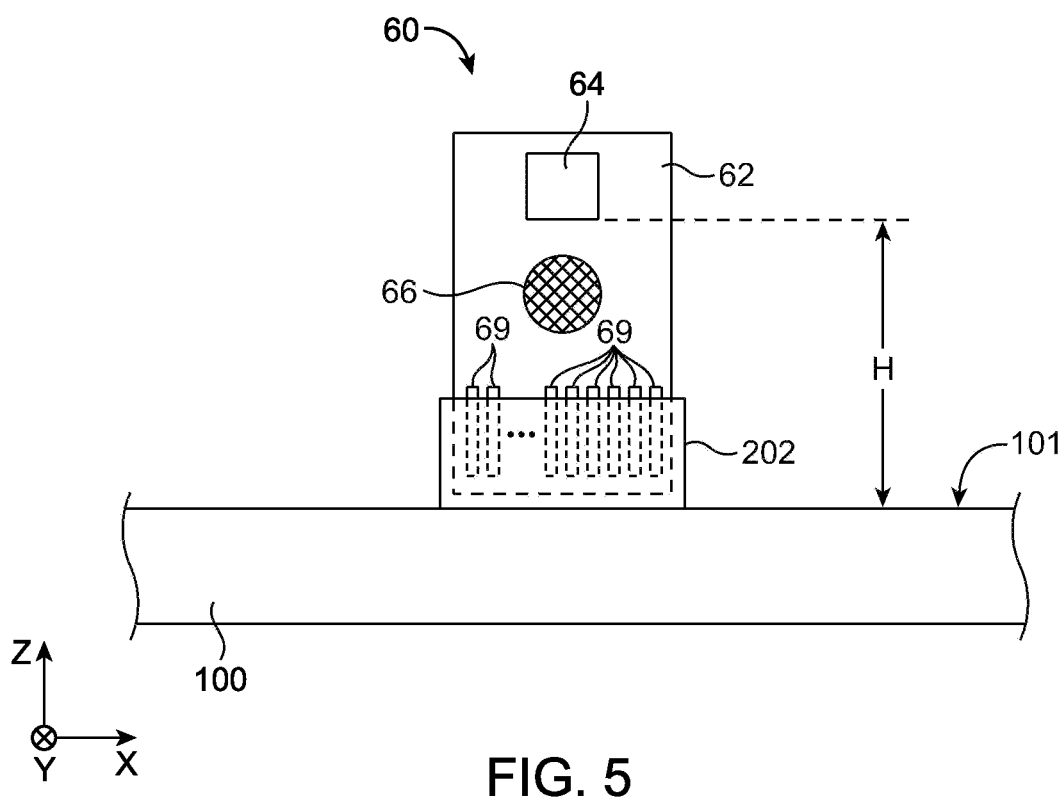
FIG. 5 is a side view of an illustrative temperature sensor module that is inserted into a flexible printed circuit (FPC) connector on a printed circuit board in accordance with some embodiments.

The embodiment described in connection with FIGS. 2-4 in which the temperature sensor module 60 includes a separate plug/connector is exemplary and is not intended to limit the scope of the present embodiments. FIG. 5 shows another embodiment of a temperature sensor module 60 having a printed circuit board that can be directly inserted into a corresponding port on the host side. As shown in FIG. 5, printed circuit board 100 can represent the main PCB or host board on which other components within network device 30 are mounted. For example, central processing unit 32, packet processor 50, other processors, memory devices 34 and 38, hardware controller 42, power manager 46, fans 48, and/or other electrical components can be mounted on one or more surfaces of host circuit board 100. Host circuit board 100 may have a surface 101 that is coplanar with the X-Y plane in FIG. 5.

A connector port such as port 202 may be mounted on surface 101 of host circuit board 100. Port 202 may be a flexible printed circuit (FPC) port, a flat flexible cable (FFC) port, or other types of hot pluggable connector ports. Connector port 202 that is configured to receive a corresponding FPC or FFC connection is sometimes referred to as an FPC/FFC socket. Port (socket) 202 may protrude vertically from surface 101 of board 100 in the Z (height) direction.

Temperature sensor module 60 may include a printed circuit board 62 and a temperature sensor die such as temperature sensor integrated circuit (IC) 64. The printed circuit board 62 of temperature sensor module 60 is sometimes referred to as a temperature sensor board or a sensor board. Temperature sensor IC (die) 64 can be mounted on a first side (surface) of temperature sensor board 62. Temperature sensor module 60 may include multiple contacts 69 formed directly on the first surface of the temperature sensor board 62. Contacts 69 may be formed from copper, aluminum, silver, gold, nickel, zinc, brass, bronze, iron, steel, some combination of these materials, other metal alloys, and/or other suitable conductive material. Contacts 69 are sometimes referred to as contact pads or conductive pads. Temperature sensor module 60 can include at least 2 contact pads, 3-5 contact pads, 5-7 contact pads, 4-8 contact pads, 6 or more contact pads, 7 or more contact pads, 8 or more contact pads, 9 or more contact pads, or 10 or more contact pads formed directly on one side of the temperature sensor board 62. Temperature sensor IC 64 may be electrically coupled to contacts 69 via one or more conductive lines formed in temperature sensor board 62.

Contacts 69 can form electrical connections with corresponding contacts in port 202 when temperature sensor module 60 is plugged into port 202. While plugged in as shown in FIG. 5, the temperature sensor IC 64 of the temperature sensor module 60 can be elevated or raised with respect to the surface 101 of host board 100 by a distance or height H. A greater height H can be technically advantageous or beneficial by ensuring that the temperature reading being measured by temperature sensor IC 64 is less of a function of the temperature at the surface 101 of host board 100 but rather more of a function of the ambient temperature in or around the housing of the overall network device 30. The distance H at which temperature sensor IC 64 is elevated above the host board surface 101 can be at least 5 millimeters (mm), 4-6 mm, 3-7 mm, 2-8 mm, more than 2 mm, more than 3 mm, more than 4 mm, more than 5 mm, more than 6 mm, more than 7 mm, 5-10 mm, or more than 10 mm.

Still referring to FIG. 5, temperature sensor board 62 can optionally include one or more cutout portions such as cutout portion 66 interposed between temperature sensor IC 64 and contacts 69. Cutout portion 66 may be a circular through hole (as shown in the example of FIG. 5). Configured in this way, cutout portion 66 can help provide further temperature isolation and thermal decoupling between IC die 64 and contacts 69 that are physically mated with port 202. Temperature sensor module 60 can include any number of cutout portions 66 (e.g., the sensor board can include two or more separate through holes, three or more separate through holes, four or more separate through holes, five to ten through holes, or more than ten through holes). Cutout portion 66 can also have any shape (e.g., cutout 66 can be a circular through hole, a square through hole, a triangular through hole, a pentagonal through hole, a hexagonal through hole, an octagonal through hole, a tapered through hole, etc.).

Figure 6:
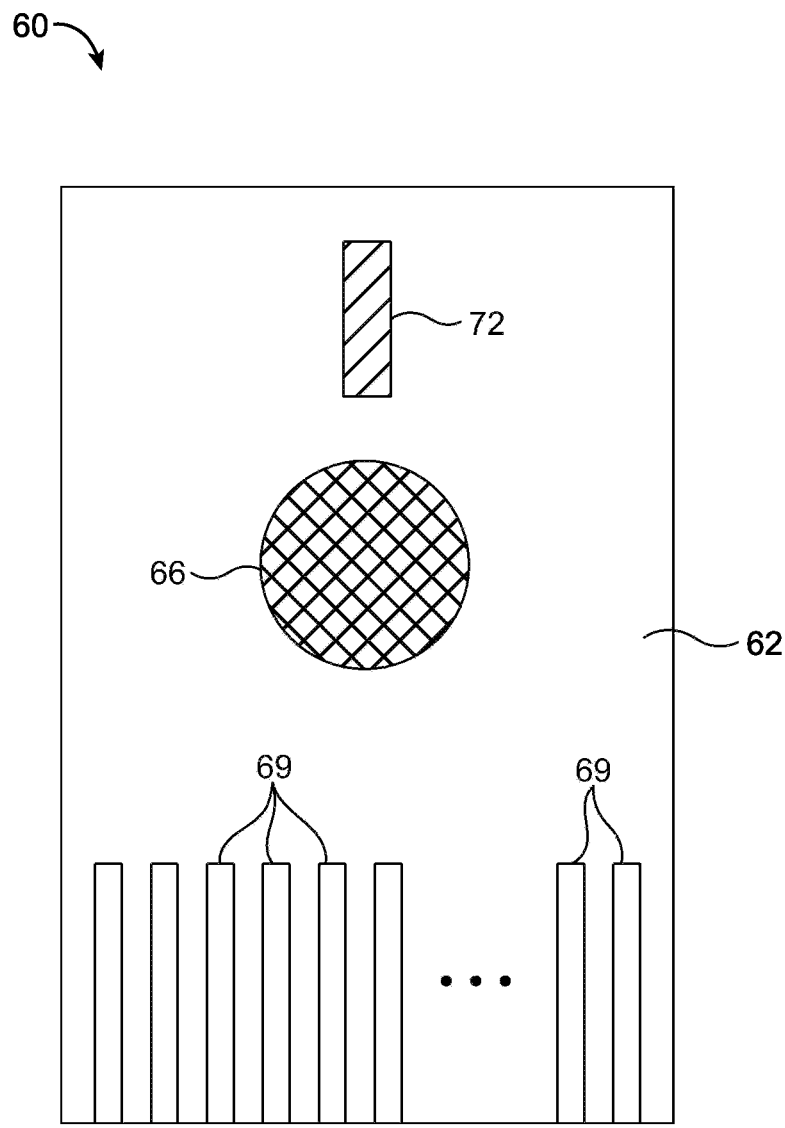
FIG. 6 is another side view of the temperature sensor module shown in FIG. 5 in accordance with some embodiments.

FIG. 6 is a side view showing the other side (second surface) of temperature sensor module 60 of the type described above in connection with FIG. 5. Through hole 66 extends between the two opposing surfaces of the temperature sensor board 62 so is also visible from the second side. An exposed conductive pad 72 may be formed at the second surface of temperature sensor board 62. Conductive pad 72 may be formed from copper, platinum, nickel, tungsten, iron, gold, silver, lead, zinc, aluminum, a combination of these materials, and/or other metal(s) suitable for temperature sensing. Conductive pad 72 formed at the outer surface of temperature sensor board 62 is therefore sometimes referred to as an exposed metal pad. Conductive pad 72 can be electrically coupled to temperature sensor IC 64 through a via within sensor board 62 (see, e.g., FIG. 4). Configured in this way, air or air flow that comes into physical contact with the exposed conductive pad 72 can result in a corresponding temperature sensor reading or output associated with the air (flow) generated at temperature sensor IC 64. The arrangement of FIG. 4 in which temperature sensor die 64 and metal pad 72 are formed at opposing surfaces of the temperature sensor board 62 is exemplary. If desired, temperature sensor die 64 and exposed metal pad 72 can be formed on the same surface of the temperature sensor board 62.

Temperature sensor module 60 may also include multiple contacts 69 formed directly on the second surface of the temperature sensor board 62. Contacts 69 may be formed from copper, aluminum, silver, gold, nickel, zinc, brass, bronze, iron, steel, some combination of these materials, other metal alloys, and/or other suitable conductive material. Contacts 69 are sometimes referred to as contact pads or conductive pads. Temperature sensor module 60 can include at least 2 contact pads, 3-5 contact pads, 5-7 contact pads, 4-8 contact pads, 6 or more contact pads, 7 or more contact pads, 8 or more contact pads, 9 or more contact pads, or 10 or more contact pads formed directly on the second surface of the temperature sensor board 62. The number of contact pads 69 formed on the second surface of board 62 may be the same as the number of contact pads 69 formed on the first surface of board 62. If desired, the number of contact pads formed on the second surface of board 62 may be different than the number of contact pads 69 formed on the first surface of board 62.

Figure 7:
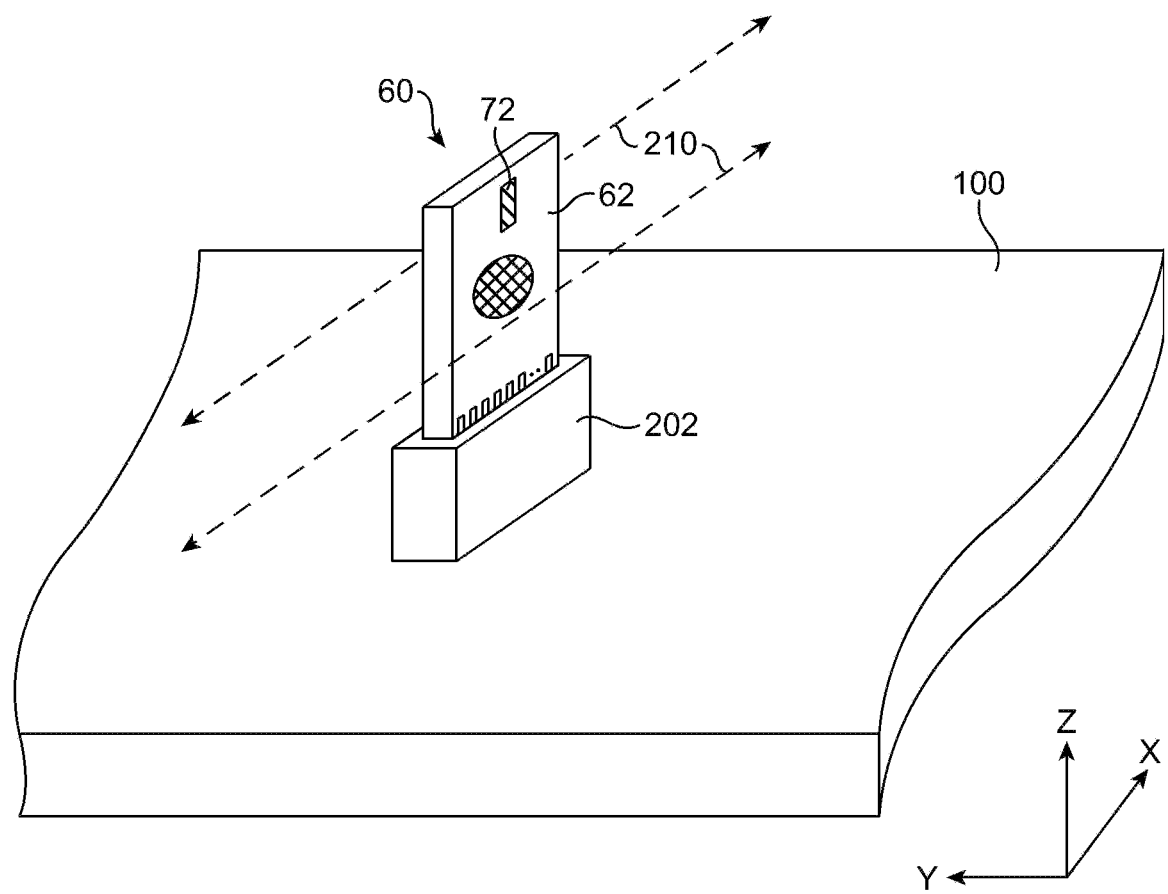
FIG. 7 is a perspective view of an illustrative temperature module of the type shown in connection with FIGS. 5-6 in accordance with some embodiments.

FIG. 7 is a perspective view of an illustrative temperature sensor module 60 of the type shown in connection with FIGS. 5-6. As shown in FIG. 7, temperature sensor module 60 may be plugged in vertically into port 202 (e.g., an FFC or FPC socket). In accordance with some embodiments, temperature sensor module 60 may be oriented in a way such that the first and second (opposing) surfaces of the temperature sensor board 62 is parallel to the air flow in the vicinity of temperature sensor module 60 or parallel to the air flow within the network device 30, as shown by arrows 210. Configured in this way, the air flow 210 can travel with minimal resistance across the exposed surface of conductive pad 72. This example in which the exposed conductive pad 72 is oriented in parallel to the direction of the air flow is illustrative. In other embodiments, the temperature sensor module 60 can be oriented in a way such that the air flow is orthogonal or perpendicular to the air flow (e.g., the direction of air flow 210 will now be parallel to the surface normal of the temperature sensor board 62). In yet other embodiments, the temperature sensor module 60 can be oriented in a way such that the air flow is angled with respect to the air flow (e.g., the direction of air flow 210 will now intersect the surface normal of the temperature sensor board 62 and form an acute angle between 0 and 90 degrees or an obtuse angle between 90 and 180 degrees).

Figure 8:
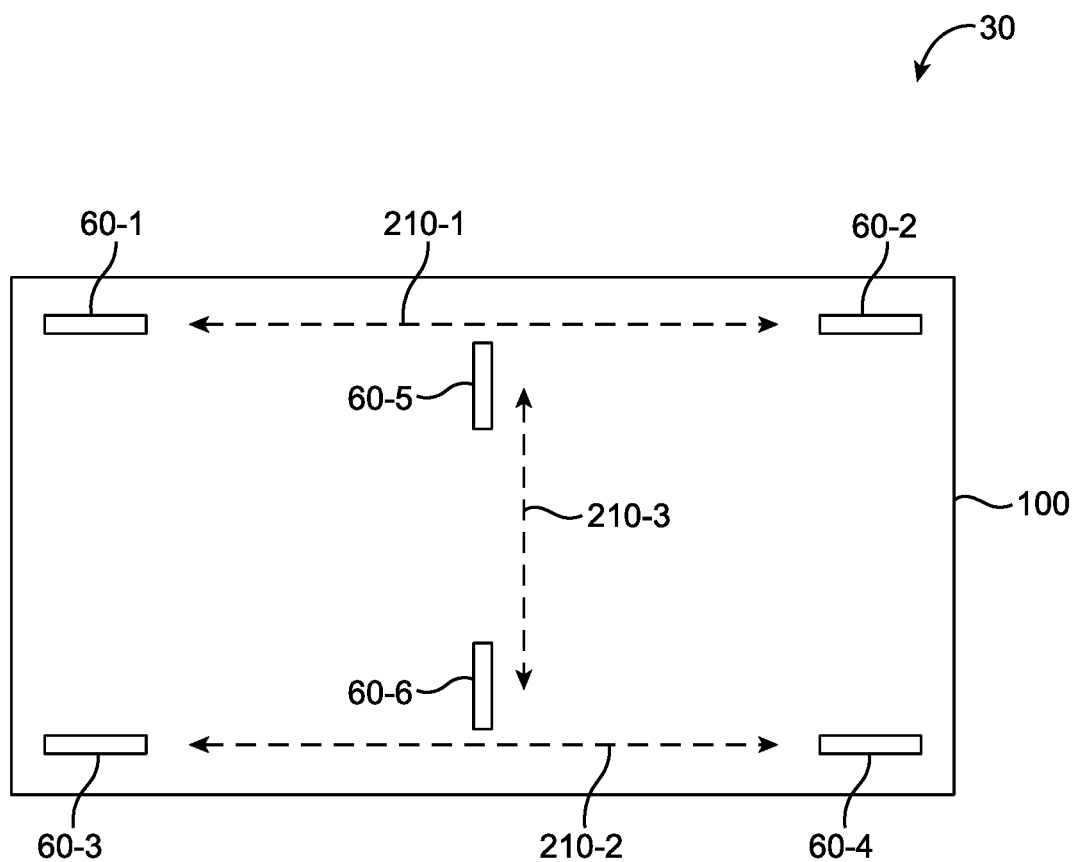
FIG. 8 is a top view showing various locations of temperature sensors within a network device in accordance with some embodiments.

FIG. 8 is a top view showing how temperature sensor modules 60 can be disposed at various locations within network device 30. Each temperature sensor module 60 can be a temperature sensor module of the type described in connection with FIGS. 2-3 or a temperature sensor module of the type described in connection with FIGS. 5-7. As shown in FIG. 8, temperature sensor module 60-1 can be disposed (plugged in) at a first corner of host circuit board 100; temperature sensor module 60-2 can be disposed (plugged in) at a second corner of host circuit board 100; temperature sensor module 60-3 can be disposed (plugged in) at a third corner of host circuit board 100; and temperature sensor module 60-4 can be disposed (plugged in) at a fourth corner of host circuit board 100. Temperature sensor modules 60-5 and 60-6 can optionally be disposed (plugged in) at some intermediate or central location of host circuit board 100. Configured in this way, temperature sensor module 60-1 and/or temperature sensor module 60-2 can be configured to measure the temperature of air flow in direction 210-1; temperature sensor module 60-3 and/or temperature sensor module 60-4 can be configured to measure the temperature of air flow in direction 210-2; and temperature sensor module 60-5 and/or temperature sensor module 60-6 can be configured to measure the temperature of air flow in direction 210-3.

The example of FIG. 8 in which network device 30 includes six temperature sensors distributed across various locations on the host circuit board 100 is merely illustrative. In general, network device 30 can include one or more temperature sensor modules 60, two or more temperature sensor modules 60, three to five temperature sensor modules 60, five to ten temperature sensor modules 60, or more than ten temperature sensor modules plugged in at one or more locations on the host circuit board, each of which is oriented in the same direction or different directions depending on the anticipated air flow in the vicinity of the respective temperature sensors.

Figure 9:
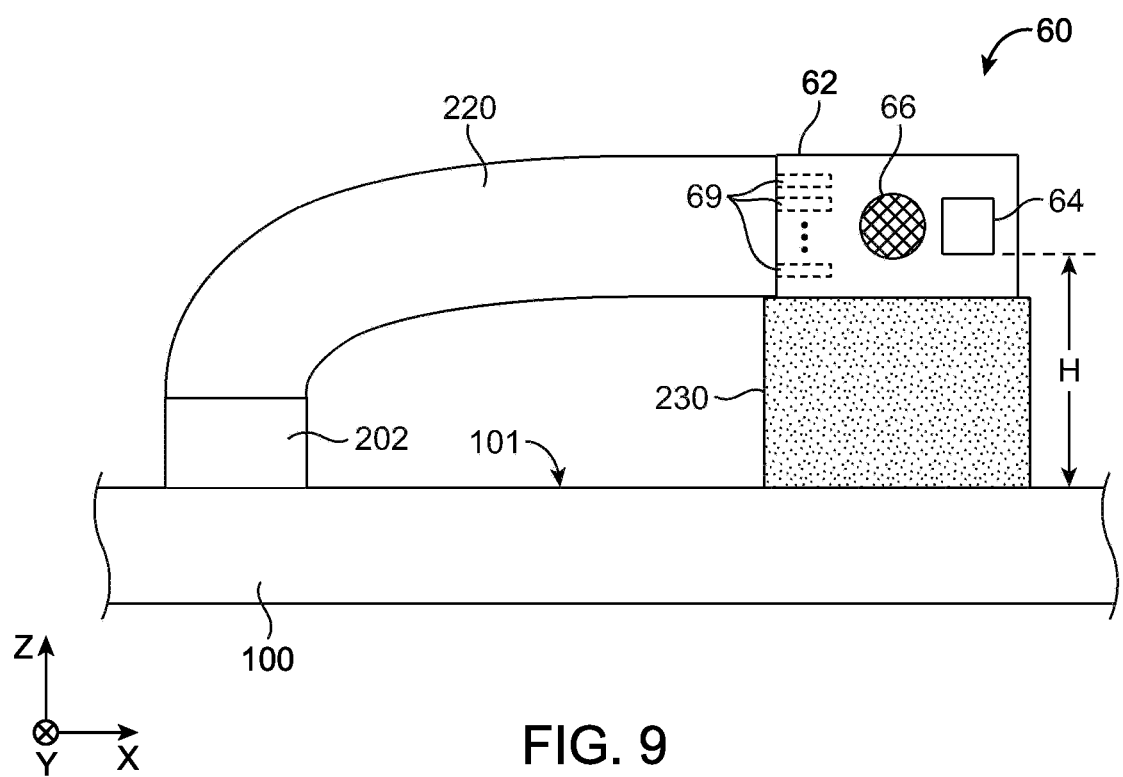
FIG. 9 is a side view of an illustrative temperature sensor module that is connected to an FPC connector via a flexible cable in accordance with some embodiments.

The embodiment of FIGS. 5-7 in which the sensor board 62 of temperature sensor module 60 can be directly inserted into port 202 protruding from the host circuit board 100 is exemplary. FIG. 9 shows another embodiment in which temperature sensor module 60 is coupled to port 202 via a flexible (flex) cable 220. As shown in FIG. 9, printed circuit board 100 can represent the main PCB or host board on which other components within network device 30 are mounted. For example, central processing unit 32, packet processor 50, other processors, memory devices 34 and 38, hardware controller 42, power manager 46, fans 48, and/or other electrical components can be mounted on one or more surfaces of host circuit board 100. Host circuit board 100 may have a surface 101 that is coplanar with the X-Y plane in FIG. 5.

A connector port such as port 202 may be mounted on surface 101 of host circuit board 100. Port 202 may be a flexible printed circuit (FPC) port, a flat flexible cable (FFC) port, or other types of hot pluggable connector ports. Connector port 202 that is configured to receive a corresponding FPC or FFC connection is sometimes referred to as an FPC/FFC socket. Port (socket) 202 may protrude vertically from surface 101 of board 100 in the Z (height) direction.

Temperature sensor module 60 may include a printed circuit board 62 and a temperature sensor die such as temperature sensor integrated circuit (IC) 64. The printed circuit board 62 of temperature sensor module 60 is sometimes referred to as a temperature sensor board or a sensor board. Temperature sensor IC (die) 64 can be mounted on a first side (surface) of temperature sensor board 62. Temperature sensor module 60 may include multiple contacts 69 formed in temperature sensor board 62. Unlike the contacts 69 of FIG. 5 (which are externally exposed), contacts 69 of FIG. 9 can be but need not be externally exposed. In other words, contacts 69 can optionally be formed under the external facing surfaces of board 62. Contacts 69 may be formed from copper, aluminum, silver, gold, nickel, zinc, brass, bronze, iron, steel, some combination of these materials, other metal alloys, and/or other suitable conductive material. Temperature sensor IC 64 may be electrically coupled to contacts 69 via one or more conductive lines formed in temperature sensor board 62.

Contacts 69 can form electrical connections with corresponding contacts in port 202 via conductive paths within flexible cable 220 when cable 220 is plugged into port 202. Flexible cable 220 may have a first distal end connected to temperature sensor module 60 and may have a second distal end that can be inserted into port (socket) 202. Flexible cable 220 can be a flat flex cable (FFC) having a flat ribbon-like structure, a shielded FFC, a zero insertion force (ZIF) FFC, a low insertion force FFC, a high temperature FFC (e.g., a flat flexible cable that can operate at temperatures of 200 degrees Celsius or more), a flexible printed circuit FFC, or other types of flex circuit cables. Using flexible cable 220 to couple the host-side port 202 to the temperature sensor module 60 allows the temperature sensor module 60 to be disposed in some other location within the device housing. This can be technically advantageous or beneficial by allowing for more flexibility in the placement of the temperature sensor module 60 when space within the network device 30 is limited. Temperature sensor module 60 can be mounted or attached to a support structure such as support structure 230. Support structure 230 can be made from insulating material to provide thermal isolation between PCB surface 101 and temperature sensor module 60.

Arranged in the way shown in FIG. 9, the temperature sensor IC 64 of the temperature sensor module 60 can be elevated or raised with respect to the surface 101 of host board 100 by a distance or height H. A greater height H can be technically advantageous or beneficial by ensuring that the temperature reading being measured by temperature sensor IC 64 is less of a function of the temperature at the surface 101 of host board 100 but rather more of a function of the ambient temperature in or around the housing of the overall network device 30. The distance H at which temperature sensor IC 64 is elevated above the host board surface 101 can be at least 5 millimeters (mm), 4-6 mm, 3-7 mm, 2-8 mm, more than 2 mm, more than 3 mm, more than 4 mm, more than 5 mm, more than 6 mm, more than 7 mm, 5-10 mm, or more than 10 mm.

Still referring to FIG. 9, temperature sensor board 62 can optionally include one or more cutout portions such as cutout portion 66 interposed between temperature sensor IC 64 and contacts 69. Cutout portion 66 may be a circular through hole (as shown in the example of FIG. 9). Configured in this way, cutout portion 66 can help provide further temperature isolation and thermal decoupling between IC die 64 and contacts 69. Temperature sensor module 60 can include any number of cutout portions 66 (e.g., the sensor board can include two or more separate through holes, three or more separate through holes, four or more separate through holes, five to ten through holes, or more than ten through holes). Cutout portion 66 can also have any shape (e.g., cutout 66 can be a circular through hole, a square through hole, a triangular through hole, a pentagonal through hole, a hexagonal through hole, an octagonal through hole, a tapered through hole, etc.). The other side of the temperature sensor module 60 of FIG. 9 is also shown in FIG. 6 and can include exposed metal pad 72, which is optionally oriented in a way that is parallel, orthogonal, or angled with respect to the air flow being sensed.

The foregoing is merely illustrative and various modifications can be made to the described embodiments. The foregoing embodiments may be implemented individually or in any combination.

What is claimed is:

1. An electronic device comprising:
    a host printed circuit board;
    a port protruding from a surface of the host printed circuit board and disposed at a first location on the host printed circuit board; and
    a sensor module comprising
        a sensor printed circuit board, and
        a sensor integrated circuit disposed on a first planar surface of the sensor printed circuit board, wherein the sensor module is configured to mate with the port, wherein the first planar surface of the sensor printed circuit board is in a fixed relation to the surface of the host printed circuit board, and wherein the sensor integrated circuit is suspended over a second location, different than the first location, on the host printed circuit board.

2. The electronic device of claim 1, wherein the sensor module further comprises:
    a conductive pad that is exposed on a second planar surface, opposing the first planar surface, of the sensor printed circuit board.

3. The electronic device of claim 2, wherein the sensor module further comprises:
    a conductive via extending between the first and second planar surfaces of the sensor printed circuit board and electrically coupling the conductive pad to the sensor integrated circuit.

4. The electronic device of claim 1, wherein the sensor integrated circuit comprises a digital temperature sensor die.

5. The electronic device of claim 4, wherein the sensor integrated circuit is disposed at a distance from the surface of the host printed circuit board that is greater than 4 millimeters.

6. The electronic device of claim 4, wherein the sensor module further comprises:
a plurality of contacts disposed along a first end of the sensor printed circuit board and configured to mate with corresponding contacts in the port, wherein the sensor integrated circuit is disposed towards a second end of the sensor printed circuit board.

7. The electronic device of claim 6, wherein the sensor printed circuit board comprises a through hole configured to provide thermal isolation between the sensor integrated circuit and the plurality of contacts.

8. The electronic device of claim 6, wherein the port comprises a flexible printed circuit (FPC) socket.

9. The electronic device of claim 4, wherein the sensor module further comprises:
a plug having a connector portion configured to mate with the port.

10. The electronic device of claim 9, wherein the sensor printed circuit board comprises a through hole configured to provide thermal isolation between the sensor integrated circuit and the plug.

11. The electronic device of claim 9, wherein the port comprises a Universal Serial Bus (USB) type socket.

12. The electronic device of claim 1, wherein the sensor module is oriented in a way such that the first side of the sensor printed circuit board is parallel to a direction of air flow within the electronic device.

13. A network device comprising:
a host board;
a port on the host board; and
a temperature sensor module configured to plug into the port, wherein the temperature sensor module comprises:
a sensor board;
a digital temperature sensor die disposed on a first surface of the sensor board, wherein the digital temperature sensor die is elevated from a surface of the host board by a distance greater than 3 millimeters; and
an exposed conductive pad disposed on a second surface of the sensor board and coupled to the digital temperature sensor die through a conductive via in the sensor board.

14. The network device of claim 13, wherein:
the port comprises a flat flexible cable (FFC) socket; and
the temperature sensor module comprises a plurality of contact pads on the sensor board configured to mate with corresponding contacts in the FFC socket.

15. The network device of claim 13, wherein:
the port comprises a Universal Serial Bus (USB) type socket; and
the temperature sensor module comprises a plug with a connector portion configured to mate with the USB type socket.

16. The network device of claim 13, wherein the port comprises a flexible printed circuit (FPC) socket.

17. An apparatus comprising:
a printed circuit board;
a port protruding from a surface of the printed circuit board and disposed at a first location on the printed circuit board;
a temperature sensor module disposed at a second location on the printed circuit board, wherein the temperature sensor module comprises a sensor board, a temperature sensor component mounted on the sensor board, and contacts on the sensor board electrically coupled to the temperature sensor component; and
a flexible cable having a first end connected to the port and having a second end connected to the temperature sensor module.

18. The apparatus of claim 17, further comprising:
a support structure configured to raise the temperature sensor module above the surface of the printed circuit board by a height that is greater than 4 millimeters.

19. The apparatus of claim 17, wherein:
the port comprises a flat flexible cable (FFC) socket; and
the flexible cable comprises a flat flexible cable.

20. The apparatus of claim 17, wherein the port comprises a flexible printed circuit (FPC) socket.

* * * * *